United States Patent
Chen et al.

(10) Patent No.: US 11,566,142 B2
(45) Date of Patent: Jan. 31, 2023

(54) CONDUCTIVE INK AND METHOD FOR PREPARING THE SAME, AND FLEXIBLE DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Hao Chen, Beijing (CN); Wei Zhang, Beijing (CN); Xingfu Zhang, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 467 days.

(21) Appl. No.: 16/605,277

(22) PCT Filed: Mar. 26, 2019

(86) PCT No.: PCT/CN2019/079703
§ 371 (c)(1),
(2) Date: Oct. 15, 2019

(87) PCT Pub. No.: WO2019/242365
PCT Pub. Date: Dec. 26, 2019

(65) Prior Publication Data
US 2021/0363372 A1 Nov. 25, 2021

(30) Foreign Application Priority Data
Jun. 21, 2018 (CN) .......................... 201810643228.0

(51) Int. Cl.
*C09D 11/52* (2014.01)
*C01G 5/00* (2006.01)
(Continued)

(52) U.S. Cl.
CPC ............... *C09D 11/52* (2013.01); *C01G 5/00* (2013.01); *C09D 11/102* (2013.01); *C09D 11/30* (2013.01);
(Continued)

(58) Field of Classification Search
None
See application file for complete search history.

(56) References Cited

U.S. PATENT DOCUMENTS

| 7,482,056 B2 | 1/2009 | Yasuda | |
| 2004/0206942 A1* | 10/2004 | Hsu | H01G 11/56 |
| | | | 252/500 |

(Continued)

FOREIGN PATENT DOCUMENTS

| CN | 1841573 A | | 10/2006 |
| CN | 101845141 A | * | 9/2010 |

(Continued)

OTHER PUBLICATIONS

English text machine translation of Yang et al. (KR 2014-0098922 A) accessed online from Espacenet; PDF copy is attached. (Year:2014).*

(Continued)

*Primary Examiner* — Katie L. Hammer
(74) *Attorney, Agent, or Firm* — Nath, Goldberg & Meyer; Joshua B. Goldberg

(57) ABSTRACT

A conductive ink is provided, which includes an ink solvent and a conductive composition dispersed in the ink solvent. The conductive composition includes a silver nanoparticle and a molecular chain of polyaniline formed on a surface of the silver nanoparticle. A method for preparing a conductive ink and a flexible display device are further provided. The conductive ink has good film forming property and good conductivity.

15 Claims, 2 Drawing Sheets

(51) Int. Cl.
| | |
|---|---|
| C09D 11/36 | (2014.01) |
| G09F 9/30 | (2006.01) |
| H05K 1/03 | (2006.01) |
| H05K 1/09 | (2006.01) |
| H05K 3/12 | (2006.01) |
| C09D 11/30 | (2014.01) |
| C09D 11/102 | (2014.01) |
| C09D 11/322 | (2014.01) |
| B82Y 40/00 | (2011.01) |
| B82Y 30/00 | (2011.01) |

(52) U.S. Cl.
CPC ............ *C09D 11/322* (2013.01); *C09D 11/36* (2013.01); *G09F 9/301* (2013.01); *H05K 1/0393* (2013.01); *H05K 1/097* (2013.01); *H05K 3/125* (2013.01); *B82Y 30/00* (2013.01); *B82Y 40/00* (2013.01); *C01P 2004/64* (2013.01); *C01P 2006/40* (2013.01); *H05K 2201/10128* (2013.01)

(56) References Cited

U.S. PATENT DOCUMENTS

| | | | |
|---|---|---|---|
| 2008/0003363 A1* | 1/2008 | Park | C09D 11/30 427/256 |
| 2008/0187651 A1* | 8/2008 | Lee | C09D 11/52 |
| 2010/0090179 A1* | 4/2010 | Mokhtari | C07F 1/005 977/810 |
| 2011/0281032 A1* | 11/2011 | Kagata | C09D 11/322 427/256 |
| 2018/0251640 A1 | 9/2018 | Reiser et al. | |

FOREIGN PATENT DOCUMENTS

| | | | | |
|---|---|---|---|---|
| CN | 103627255 A | 3/2014 | | |
| CN | 104637570 A | 5/2015 | | |
| CN | 105542157 A | 5/2016 | | |
| CN | 107790741 A | 3/2018 | | |
| CN | 108026397 A | 5/2018 | | |
| CN | 108774430 A | 11/2018 | | |
| EP | 3301686 A1 * | 4/2018 | ............... | H01B 1/02 |
| KR | 100816222 B1 | 3/2008 | | |
| KR | 20140098922 A * | 8/2014 | | |

OTHER PUBLICATIONS

English text machine translation of Li et al. (CN 101845141 A) accessed online from Espacenet; PDF copy is attached. (Year: 2010).*
"Synthesis of several core-shell structure-inorganic nanoparticles coated with conductuing polymer composites and the study of their properties", Shengyu Jing, China Doctoral Dissertation Full-text Database Engineering Science and Technology Series I, B020-69, published Aug. 15, 2009.
Decision of Rejection dated Feb. 21, 2020 issued in corresponding Chinese Application No. 201810643228.0.
Office Action dated May 29, 2019 issued in corresponding Chinese Application No. 201810643228.0.
Office Action dated Nov. 8, 2019 issued in corresponding Chinese Application No. 201810643228.0.

* cited by examiner

CONDUCTIVE INK AND METHOD FOR PREPARING THE SAME, AND FLEXIBLE DISPLAY DEVICE

CROSS-REFERENCE TO RELATED APPLICATION

This is a National Phase application filed under 35 U.S.C. 371 as a national stage of PCT/CN2019/079703, filed Mar. 26, 2019, an application claiming the benefit of Chinese Patent Application No. 201810643228.0, entitled "CONDUCTIVE COMPOSITION AND METHOD FOR PREPARING THE SAME, CONDUCTIVE INK, AND FLEXIBLE DISPLAY DEVICE", filed on Jun. 21, 2018, the content of each of which is incorporated herein by reference in their entirety.

TECHNICAL FIELD

The disclosure relates to the field of inkjet printing, and in particular, to a conductive ink, a method for preparing the same, and a flexible display device.

BACKGROUND

Printed electronics technology has broad application prospects in large-scale and flexible electronic devices. Conventional methods for preparing electronic device mainly include photolithography, vacuum evaporation, and electroless plating, but these methods face with problems such as complicated equipment, complicated preparing process, and difficulty in preparing large-scale electronic devices on a flexible substrate. A novel inkjet printing technology prints a conductive film having electrical conductivity, light transmittance, and mechanical flexibility on a flexible substrate by inkjet printing with nano-sized conductive ink. Therefore, flexible circuits manufactured by inkjet printing technology have great application potential in flexible display devices.

Nano-sized metal conductive ink is widely used in inkjet printing technology. This type of ink can uniformly disperse the conductive filler in the ink, thereby preventing a problem that the printed conductive pattern exhibits poor performance uniformity. The nano-sized conductive filler of nano-sized metal conductive ink mainly include silver, gold, copper, etc., wherein the silver is widely used because of its moderate price, good conductivity and good performance stability.

SUMMARY

As an aspect of the disclosure, a conductive ink is provided, which includes an ink solvent and a conductive composition dispersed in the ink solvent, wherein the conductive composition includes a silver nanoparticle and a molecular chain of polyaniline formed on a surface of the silver nanoparticle.

In an embodiment, the ink solvent includes N-methylpyrrolidone.

In an embodiment, the ink solvent has a volume which is about 50% of a volume of the conductive ink.

As another aspect of the disclosure, a method for preparing a conductive ink is provided, which includes: preparing a suspension of silver nanoparticle; mixing aniline with the suspension of silver nanoparticle to obtain a mixed solution; treating the mixed solution to agglomerate the aniline with a silver nanoparticle in the suspension to obtain a conductive composition; and dispersing the conductive composition in an ink solvent.

In an embodiment, the ink solvent includes N-methylpyrrolidone.

In an embodiment, the ink solvent has a volume which is about 50% of a volume of the conductive ink.

In an embodiment, the preparing the suspension of silver nanoparticle includes: mixing a silver nitrate solution with thioglycolic acid and a sodium halide solution to obtain a first reaction solution containing soluble silver halide; causing the first reaction solution to sufficiently react with sodium borohydride to obtain the suspension of silver nanoparticle.

In an embodiment, the sodium halide includes sodium iodide and/or sodium bromide.

In an embodiment, a concentration of the silver nitrate solution ranges from about 0.1 mol/L to 0.2 mol/L, a concentration of the sodium halide solution ranges from about 0.1 mol/L and 0.2 mol/L, and a ratio of volumes of the silver nitrate solution, the thioglycolic acid, and the sodium halide solution is about 2:1:(8~10).

In an embodiment, the treating the mixed solution includes: adding ammonium persulphate as an initiator to the mixed solution, wherein the ammonium persulphate initiator as an initiator of about 0.1 g to about 0.3 g is added per 100 ml of the mixed solution.

In an embodiment, in the mixing the aniline with the suspension of silver nanoparticle, a ratio of volumes of the aniline to the suspension of nanosilver particle is about 1:(3~5).

As a third aspect of the disclosure, a display device is provided, which includes a substrate and a circuit structure formed on the substrate, wherein at least a portion of the circuit structure is formed by inkjet printing using the conductive ink according to the embodiments of the disclosure.

In an embodiment, the display device is a flexible display device, and the substrate is a flexible substrate.

BRIEF DESCRIPTION OF THE DRAWINGS

The accompanying drawings, which provide a further understanding of the present disclosure and constitute a part of the specification, are used in conjunction with the following specific embodiments to explain the present disclosure, but are not intended to limit the present disclosure. In the drawings.

DETAILED DESCRIPTION

Exemplary embodiments of the present disclosure will be described in detail below with reference to the accompanying drawings. It is to be understood that the embodiments described herein are merely for describing and explaining the present disclosure rather than limiting the present disclosure.

The conventional conductive ink using nano silver as the conductive filler is mainly made of any of silver nanoparticle, silver nanosheet, silver nanowire, and the like, or a mixture thereof. The addition of polymer molecules can solve to some extent a problem that a conductive structure, such as the silver nanoparticle, the silver nanosheet and the silver nanowire, has a reduced conductivity and a poor dispersion uniformity due to gaps therebetween. However, a general polymer has poor conductivity, and simply mixing of the nano silver and the polymer in the conductive ink still has to some extent a negative effect such as non-uniform dispersion and poor adhesion, thereby resulting in reduced performance of a printed conductive wire.

A conductive ink, a method for preparing the same, and a flexible display device are provided in the disclosure, which realizes good adhesion between a circuit formed by the conductive ink and the substrate.

In order to achieve the above objectives, as a first aspect of the disclosure, a conductive ink is provided. The conductive ink includes an ink solvent and a conductive composition dispersed in the ink solvent. The conductive composition includes a silver nanoparticle and a molecular chain of polyaniline formed on a surface of the silver nanoparticle.

In the disclosure, the component of the ink solvent is not limited herein. In an embodiment, the ink solvent includes N-methylpyrrolidone (the chemical formula thereof is $C_5H_9NO$, also known as NMP, 1-methyl-2-pyrrolidone, or N-methyl-2-pyrrolidone). As a specific embodiment, the volume of the added ink solvent is about 50% of the volume of the conductive ink.

Figure 1:
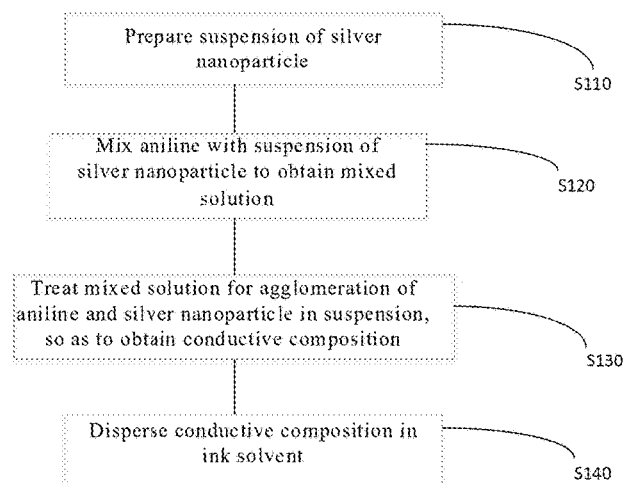
FIG. 1 is a schematic flowchart showing a method for preparing conductive ink according to an embodiment of the present disclosure.

As a second aspect of the disclosure, a method for preparing a conductive composition of a conductive ink is provided, as shown in FIG. 1, the method includes step S110 to step S140.

At step S110, a suspension of silver nanoparticle is prepared.

At step S120, the aniline is mixed with the suspension of silver nanoparticle to obtain a mixed solution.

At step S130, the mixed solution is treated for agglomeration of the aniline and a silver nanoparticle in the suspension, so as to obtain the conductive composition.

At step S140, the conductive composition is dispersed in the ink solvent.

The ink solvent includes N-methylpyrrolidone.

The conductive ink has good fluidity and dispersibility. After a circuit is formed by inkjet printing using the conductive ink and sintered, a conductive film having good contact, excellent conductivity, and good mechanical flexibility can be formed. After in contact with the silver nanoparticles in the suspension of silver nanoparticle, the aniline(s) can be bonded with the silver nanoparticle to modify the surface the silver nanoparticle. After the aniline(s) is agglomerated with the silver nanoparticle, the conductive composition obtained in the step S130 is the silver nanoparticle bonded with molecular chain(s) of polyaniline. Since polyaniline is an organic substance, the conductive ink may have good fluidity and dispersibility after being mixed with the ink solvent made of the organic substance. After the circuit is formed by inkjet printing using the conductive ink, the circuit has good film forming property.

After the circuit is formed by inkjet printing using the conductive ink and sintered, the molecular chain of polyaniline may fill the gap between the silver nanoparticles, thereby improving electrical contact and electron transport capability between the silver nanoparticles, and improving electrical performance of the circuit.

In addition, since the polyaniline film itself has good film forming property and mechanical flexibility, the circuit formed by inkjet printing using the conductive ink obtained by bonding the polyaniline film and the silver nanoparticle, has good mechanical flexibility.

In the disclosure, manner for preparing the suspension of silver nanoparticle is not limited herein. For example, in an embodiment, the step S110 may include the following steps.

A silver nitrate solution is mixed and reacted with thioglycolic acid ($HSCH_2COOH$) and a sodium halide solution (e.g., the sodium iodide solution or the sodium bromide solution) to obtain a first reaction solution (the first reaction solution includes silver halide particles with carboxyl group(s) on the surface thereof) containing soluble silver halide (when the sodium halide solution is sodium iodide solution, the silver halide is silver iodide; and when the sodium halide solution is the sodium bromide solution, the silver halide is silver bromide);

The silver nitrate solution, the thioglycolic acid, and the sodium halide solution in the first reaction solution are sufficiently reacted with each other under reduction of sodium borohydride ($NaBH_4$) to obtain the suspension of the silver nanoparticle. Specifically, silver halide particle with carboxyl group(s) on the surface is reduced to silver nanoparticle under the reduction effect of the sodium borohydride. In the disclosure, the specific amount of the sodium borohydride is not limited herein. For example, sodium borohydride may be excessively added, such that the silver nitrate, thioglycolic acid, and a sodium halide in the first reaction solution are sufficiently reacted with each other. In order to reduce the amount of sodium borohydride, the amount of sodium borohydride added satisfies the following requirements: the molar ratio of silver element to sodium borohydride in the first reaction solution is about 1:2.

Figure 2:
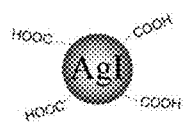
FIG. 2 is a schematic diagram showing a silver iodide particle with a carboxyl group on a surface thereof.

In the silver halide solution, carboxyl group(s) is also formed on the surface of the silver halide. As shown in FIG. 2, when the silver halide is silver iodide, carboxyl group(s) is formed on the surface of the silver iodide particle. The carboxyl group can serve as a medium for dissolving the silver nanoparticle in the water, thereby facilitating in uniform contact with and mixing with the aniline in a subsequent step.

Figure 3:
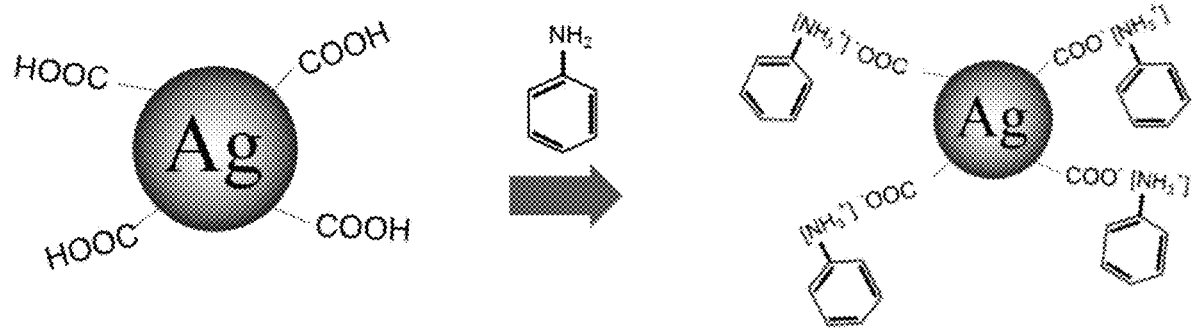
FIG. 3 is a chemical reaction formula of a reaction between a silver nanoparticle and an aniline, wherein carboxyl groups are on the surface of the silver nanoparticle.
Figure 4:
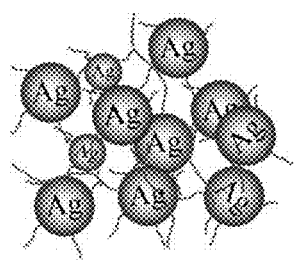
FIG. 4 is a schematic diagram showing a conductive composition according to the disclosure.

When the silver halide particle is reduced to the silver nanoparticle, the surface of the silver nanoparticle is still bonded with the carboxyl group(s). The aniline(s) is reacted with the silver nanoparticle with the carboxyl group(s) on its surface, the reaction formula is shown in FIG. 3. The aniline(s) is agglomerated with the carboxyl group(s) to form polyaniline, and the molecular chain(s) of polyaniline is formed on the silver nanoparticle, as shown in FIG. 4.

According to an embodiment of the disclosure, a concentration of the silver nitrate solution ranges from about 0.1 mol/L to 0.2 mol/L. A concentration of the sodium halide solution ranges from about 0.1 mol/L to 0.2 mol/L. A ratio of the volume of the silver nitrate solution, the volume of thioglycolic acid, and the volume of the sodium halide solution is 2:1:10.

In some embodiments, at step S130, ammonium persulphate (APS) as an initiator is added into the mixed solution. In some embodiments, the ammonium persulphat as the initiator of about 0.1 g to about 0.3 g is added per 100 ml of the mixed solution.

The ammonium persulphate as the initiator can initiate agglomeration reaction of the aniline(s) and the silver nanoparticle to obtain polyaniline.

In some embodiments, in step S120, a ratio of volume of the aniline to the volume of the suspension of silver nanoparticle is about 1:(3~5).

In the disclosure, the solution obtained in step S130 is filtered, washed with ethanol and deionized water, and dried, then the dried product is obtained as the conductive composition.

As described above, after in contact with the silver nanoparticles in the suspension of silver nanoparticle, the aniline can be bonded with the silver nanoparticle to modify the surface of the silver nanoparticle. After the aniline is agglomerated with the silver nanoparticle, the conductive composition obtained in the step S130 is the silver nanoparticle loaded with the molecular chains of polyaniline. Since polyaniline is an organic substance, the conductive ink may have good fluidity and dispersibility after the polyaniline is mixed with the ink solvent made of the organic substance. After a circuit is formed by inkjet printing using the conductive ink, the circuit has good film forming property.

After the circuit is formed by inkjet printing using the conductive ink and sintered, the molecular chain of polyaniline may fill the gap between the silver nanoparticles, such that the electrical contact and electron transport capability between the silver nanoparticles are improved, thereby improving electrical performance of the circuit.

In addition, since the polyaniline film itself has good film forming property and mechanical flexibility, the circuit, formed by inkjet printing with the conductive ink obtained by bonding the polyaniline film with the silver nanoparticle, has good mechanical flexibility.

As a third aspect of the disclosure, a flexible display device is provided, which includes a flexible substrate and a circuit structure formed on the flexible substrate, wherein the circuit structure is formed by inkjet printing using the conductive ink according to the disclosure.

The circuit structure, which is formed by inkjet printing using the conductive ink according to the disclosure, has good film forming property and can be firmly attached to the flexible substrate, thereby avoiding a risk that the circuit structure being peeling off from the flexible substrate. Moreover, the conductive ink has good conductivity, and thus the flexible display device has better performance.

In an embodiment, at step S110, a silver nitrate solution with a concentration of 0.1 mol/L and a volume of 20 mL, thioglycolic acid with a volume of 10 mL, and a sodium iodide solution with a concentration of 0.1 mol/L and a volume of 100 mL are mixed, sufficiently stirred, and reacted with each other for a period of time so as to obtain a first reaction solution; the sodium borohydride may be excessively added into the first reaction solution, such that the components in the first reaction solution are sufficiently reacted with each other so as to obtain a suspension of the silver nanoparticle.

At step S120, the aniline is added to the suspension of silver nanoparticle, wherein the ratio of volumes of the aniline to the suspension of silver nanoparticle is 1:3.

At step S130, ammonium persulphate of 0.3 g as an initiator is added, such that the aniline and the silver nanoparticle are agglomerated together. After the resulted solution is filtered, and then washed with ethanol and deionized water, the conductive composition is obtained.

At step S140, the conductive composition is uniformly mixed with an N-methylpyrrolidone solvent to obtain a conductive ink. The conductive ink has good fluidity and dispersibility. After a circuit is formed by inkjet printing using the conductive ink and sintered, a conductive film having good contact, excellent conductivity, and good mechanical flexibility can be formed.

In an embodiment, at step S110, a silver nitrate solution with a concentration of 0.2 mol/L and a volume of 20 mL, thioglycolic acid with a volume of 10 mL, and a sodium iodide solution with a concentration of 0.2 mol/L and a volume of 80 mL are mixed, sufficiently stirred, and reacted with each other for a period of time to obtain a first reaction solution; the sodium borohydride may be excessively added into the first reaction solution, such that the components in the first reaction solution are sufficiently reacted with each other to obtain a suspension of the silver nanoparticle.

At step S120, the aniline is added to the suspension of silver nanoparticle, wherein the ratio of volumes of the aniline to the suspension of silver nanoparticle is 1:5.

At step S130, ammonium persulphate of 0.4 g as an initiator is added, such that the aniline and the silver nanoparticle are agglomerated together. After the resulted solution is filtered, and then washed with ethanol and deionized water, the conductive composition is obtained.

At step S140, the conductive composition is uniformly mixed with an N-methylpyrrolidone solvent to obtain a conductive ink. The conductive ink has good fluidity and dispersibility. After a circuit is formed by inkjet printing using the conductive ink and sintered, a conductive film having good contact, excellent conductivity, and good mechanical flexibility can be formed.

In an embodiment, at step S110, a silver nitrate solution with a concentration of 0.15 mol/L and a volume of 20 mL, thioglycolic acid with a volume of 10 mL, and a sodium iodide solution with a concentration of 0.15 mol/L and a volume of 80 mL are mixed, sufficiently stirred, and reacted with each other for a period of time to obtain a first reaction solution; the sodium borohydride may be excessively added into the first reaction solution, such that the components in the first reaction solution are sufficiently reacted with each other to obtain a suspension of the silver nanoparticle.

At step S120, the aniline is added to the suspension of silver nanoparticle, wherein the ratio of volumes of the aniline to the suspension of silver nanoparticle is 1:4.

At step S130, ammonium persulphate of 0.14 g as an initiator is added, such that the aniline and the silver nanoparticle are agglomerated together. After the resulted solution is filtered, and washed with ethanol and deionized water, the conductive composition is obtained.

At step S140, the conductive composition is uniformly mixed with an N-methylpyrrolidone solvent to obtain a conductive ink. The conductive ink has good fluidity and dispersibility. After a circuit is formed by inkjet printing using the conductive ink and sintered, a conductive film having good contact, excellent conductivity, and good mechanical flexibility can be formed.

It should be noted that, in step S110, the sodium iodide may be replaced by a sodium bromide solution having the same molar concentration and volume as those of the sodium iodide, or by a mixed solution of sodium iodide and sodium bromide having the same molar concentration and volume as those of the sodium iodide. In this case, resulted conductive composition also has good fluidity and dispersibility, and the resulted conductive ink can form a conductive film having excellent conductivity and good mechanical flexibility.

It should be understood that the above embodiments are merely exemplary embodiments for the purpose of illustrating the principles of the present disclosure, and the present disclosure is not limited thereto. It will be apparent to those skilled in the art that various changes and improvements can be made without departing from the essence and spirit of the present disclosure, and the changes and improvements are also to be regarded as falling within the scope of the present disclosure.

What is claimed is:

1. A conductive ink, comprising an ink solvent and a conductive composition dispersed in the ink solvent, wherein the conductive composition comprises silver nanoparticles bonded with molecular chains of polyaniline on a surface of the silver nanoparticles wherein the silver nanoparticles have —COO⁻ groups and the molecular chains of polyaniline are bonded to the surface of the silver nanoparticles via —[NH₃⁺]⁻OOC— structure.

2. The conductive ink according to claim 1, wherein the ink solvent comprises N-methylpyrrolidone.

3. The conductive ink according to claim 2, wherein the ink solvent has a volume which is about 50% of a volume of the conductive ink.

4. A method for preparing a conductive ink, comprising:
preparing a suspension of silver nanoparticles having carboxylic groups on a surface thereof;
mixing aniline with the suspension of silver nanoparticles to obtain a mixed solution;
treating the mixed solution to react the aniline with carboxyl groups on the surface of the silver nanoparticles in the suspension;
agglomerating the aniline with the carboxylic groups on the surface of the silver nanoparticles to form molecular chains of polyaniline on the surface of the silver nanoparticles, thereby obtaining a conductive composition, wherein the molecular chains of polyaniline are bonded to the surface of the silver nanoparticles via —[NH₃⁺]⁻OOC— structure; and
dispersing the conductive composition in an ink solvent.

5. The method according to claim 4, wherein the dispersing the conductive composition in the ink solvent comprises dispersing the conductive composition in a solvent of N-methylpyrrolidone.

6. The method according to claim 5, wherein in the dispersing the conductive composition in an ink solvent, the ink solvent has a volume which is about 50% of a volume of the conductive ink.

7. The method according to claim 6, wherein the preparing the suspension of silver nanoparticle comprises:
mixing a silver nitrate solution, thioglycolic acid, and a sodium halide solution to obtain a first reaction solution containing soluble silver halide;
causing the first reaction solution to sufficiently react with sodium borohydride to obtain the suspension of silver nanoparticle.

8. The method according to claim 7, wherein the sodium halide comprises sodium iodide and/or sodium bromide.

9. The method according to claim 8, wherein
a concentration of the silver nitrate solution ranges from about 0.1 mol/L to 0.2 mol/L;
a concentration of the sodium halide solution ranges from about 0.1 mol/L and 0.2 mol/L; and
a ratio of volumes of the silver nitrate solution, the thioglycolic acid, and the sodium halide solution is about 2:1:(8~10).

10. The method according to claim 9, wherein the treating the mixed solution comprises:
adding ammonium persulphate as an initiator to the mixed solution, wherein the ammonium persulphate initiator as an initiator of about 0.1 g to about 0.3 g is added per 100 ml of the mixed solution.

11. The method according to claim 4, wherein, in the mixing the aniline with the suspension of silver nanoparticle, a ratio of volumes of the aniline to the suspension of nanosilver particle is about 1:(3~5).

12. A display device, comprising a substrate and a circuit structure formed on the substrate, wherein at least a portion of the circuit structure is formed by inkjet printing using the conductive ink according to claim 1.

13. The display device according to claim 12, wherein the display device is a flexible display device, and the substrate is a flexible substrate.

14. A display device, comprising a substrate and a circuit structure formed on the substrate, wherein at least a portion of the circuit structure is formed by inkjet printing using the conductive ink according to claim 2.

15. A display device, comprising a substrate and a circuit structure formed on the substrate, wherein at least a portion of the circuit structure is formed by inkjet printing using the conductive ink according to claim 3.

* * * * *